United States Patent [19]
Co et al.

[11] Patent Number: 5,834,950
[45] Date of Patent: Nov. 10, 1998

[54] PHASE DETECTOR WHICH ELIMINATES FREQUENCY RIPPLE

[75] Inventors: Ramon S. Co, Milpitas; Richard L. Traber, Fremont, both of Calif.

[73] Assignee: 3Com Corporation, Santa Clara, Calif.

[21] Appl. No.: 214,376

[22] Filed: Mar. 17, 1994

[51] Int. Cl.[6] .................................................. H03K 5/26
[52] U.S. Cl. ...................... 327/12; 327/3; 327/5
[58] Field of Search .................. 327/2, 3, 5, 7, 327/12, 231, 233, 236, 10, 8

[56] References Cited

U.S. PATENT DOCUMENTS

| | | | |
|---|---|---|---|
| 4,050,024 | 9/1977 | Winston, IV | 328/134 |
| 4,051,440 | 9/1977 | Nelson et al. | 327/5 |
| 4,222,013 | 9/1980 | Bowers et al. | 327/7 |
| 4,599,510 | 7/1986 | Cloke | 327/7 |
| 4,641,087 | 2/1987 | Coffield | 327/12 |
| 4,682,116 | 7/1987 | Wolvaver et al. | 327/5 |
| 4,806,870 | 2/1989 | Scheller | 327/7 |
| 4,932,041 | 6/1990 | Eiberger et al. | 375/120 |
| 5,126,602 | 6/1992 | Lee et al. | |
| 5,136,253 | 8/1992 | Ueno | 327/12 |
| 5,180,933 | 1/1993 | Krzyzanowski | 307/514 |
| 5,223,755 | 6/1993 | Richley | 307/603 |
| 5,260,975 | 11/1993 | Saito | 328/133 |

FOREIGN PATENT DOCUMENTS 404035522  2/1992  Japan ...................... 327/12

Primary Examiner—Timothy P. Callahan
Assistant Examiner—T. Lam
Attorney, Agent, or Firm—Benman Collins & Sawyer

[57] ABSTRACT

A phase detector is disclosed that eliminates frequency ripple in a phase-locked loop circuit. The detector includes first and second circuits for providing UP and DOWN signals respectively. It also includes a delay element for setting the duration of the DOWN signal so as to eliminate phase jitter and static phase offset.

9 Claims, 5 Drawing Sheets

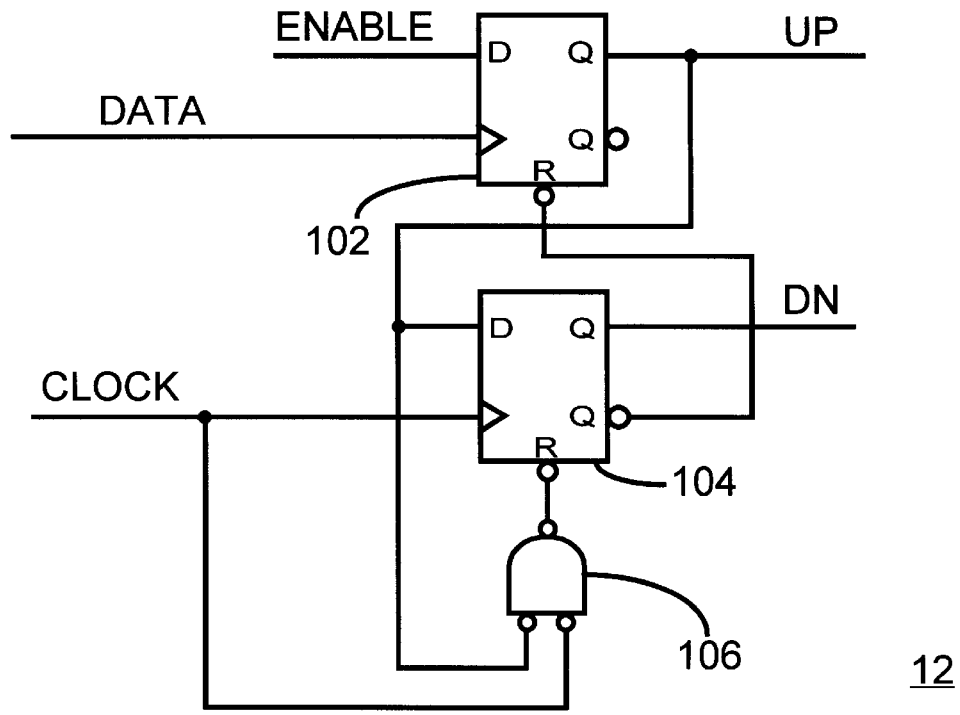
Fig. 2 : Prior Art
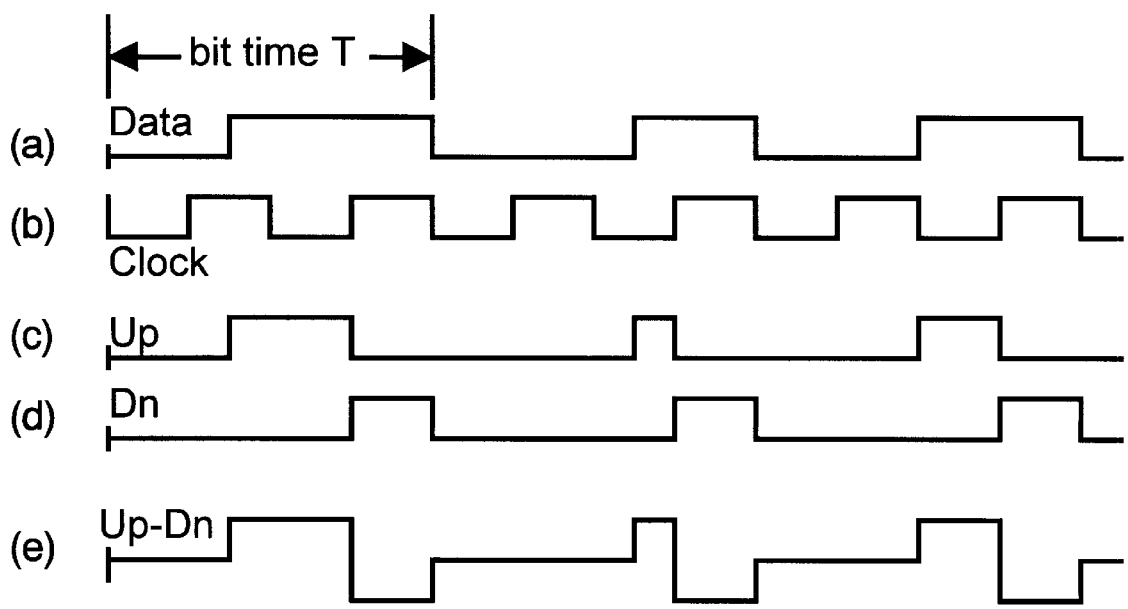
Fig. 3 : Prior Art

PHASE DETECTOR WHICH ELIMINATES FREQUENCY RIPPLE

FIELD OF THE INVENTION

The present invention relates to a phase detector employed in phase-locked loops and more particularly, to a phase detector that has the primary function of timing recovery or clock recovery.

BACKGROUND OF THE INVENTION

Phase detectors are utilized in a variety of applications for clock recovery. Typically, phase detectors operate on data transitions. Hence, whenever there is a data transition an error signal is generated. Conventional phase detectors generally operate on either a rising edge of the data signal or on both the rising and falling edges of the data signal. Phase detectors typically generate UP and DOWN signals and are commonly found in conventional phase locked loop (PLL) circuits.

In conventional phase detectors, when the clock signal input to the phase detector leads the data signal rising edge, an UP signal is generated which is narrower than the DOWN signal. When the clock signal lags the data signal rising edge, an UP signal is generated which is wider than the DOWN signal. When the clock signal coincides with the data signal rising edge, the UP and DOWN signals have equal pulse widths. The average of the UP and DOWN signals allows the phase locked loop (PLL) to remain locked.

The correction information of the PLL is essentially contained in the UP pulse. Although the DOWN pulse may appear to have a constant pulse width, it is really a function of the instantaneous frequency of a voltage controlled oscillator (VCO) of the PLL and can vary from cycle to cycle thereby decreasing the capacity of the phase detector to accurately measure the phase error.

A drawback of this implementation is that the net signal (UP-DOWN) contains a high frequency signal component (one full cycle, occurring at the correction rate of the phase detector) that modulates the VCO of the PLL. The effect is a phase jitter on the clock signal (VCO output) known as frequency ripple. This ripple can be reduced by increasing the value of the capacitor ($C_1$) of a typical loop filter utilized in the PLL (a typical loop filter may consist of a capacitor ($C_1$) in parallel with a resistor (R) in which R is in series with another capacitor ($C_2$). Increasing $C_1$, however, lowers the value of the high frequency pole of the PLL (the high frequency pole is inversely proportional to the $RC_1$ product) which results in peaking of the phase response of the PLL.

The phase detector also has another drawback—the so called static phase offset. In static phase offset, the clock signal is not centered at the data signal but slightly to the left. When the clock is locked to the data signal in the steady state, the UP signal occurs before the DOWN signal. The UP signal tells the VCO to move forward, causing the clock to shift slightly to the left. Then afterwards, the DOWN signal is generated telling the VCO to move backward. This tends to shorten the negative cycle of the VCO and lengthens its positive cycle. The result is when the rising edge of the clock is used to sample the data signal to recover the data information, the data signal is not sampled in the middle but slightly to the left (depending on the loop filter used). This lowers the jitter tolerance of the PLL.

For many applications such as a token ring network application, the peaking in the phase response is undesirable because of jitter amplification as stations within the network are chained together in a ring configuration. The high frequency ripple on the clock is also undesirable because it introduces unnecessary jitter on the clock signal. The clock signal is used as the timing signal for retransmission of the data in the network. The high frequency ripple reduces the jitter tolerance (or the jitter margin) of the next station in the ring. The high frequency ripple is also accumulated in the ring as jitter causing further transmission problems.

Consequently, a need exists for a phase detector that provides low frequency ripple, alleviates jitter peaking, and provides low static phase offset. The present invention addresses such a need.

SUMMARY OF THE INVENTION

An improved phase detector in accordance with the present invention is disclosed. The phase detector comprises first circuit means for receiving a data signal and a clock signal and providing a first signal; second circuit means for receiving a data signal and providing a second signal; and delay means coupled to the second circuit means for causing the second signal to have a predetermined pulse width.

In this embodiment, the first signal is an UP signal and the second signal is a DOWN signal. By causing the UP and DOWN signals to happen simultaneously and by causing the DOWN signal to have a predetermined pulse width, the problems associated with frequency ripple of prior art phase detectors are substantially eliminated.

BRIEF DESCRIPTION OF THE DRAWINGS

FIG. 2 is a block diagram of a prior art phase detector circuit

FIG. 3 is a timing diagram of the operation of the phase detector circuit of FIG. 2.

DETAILED DESCRIPTION OF THE INVENTION

The present invention relates to an improvement in a phase detector utilized in a phase-locked loop (PLL) circuit. The following description is presented to enable one of ordinary skill in the art to make and use the present invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
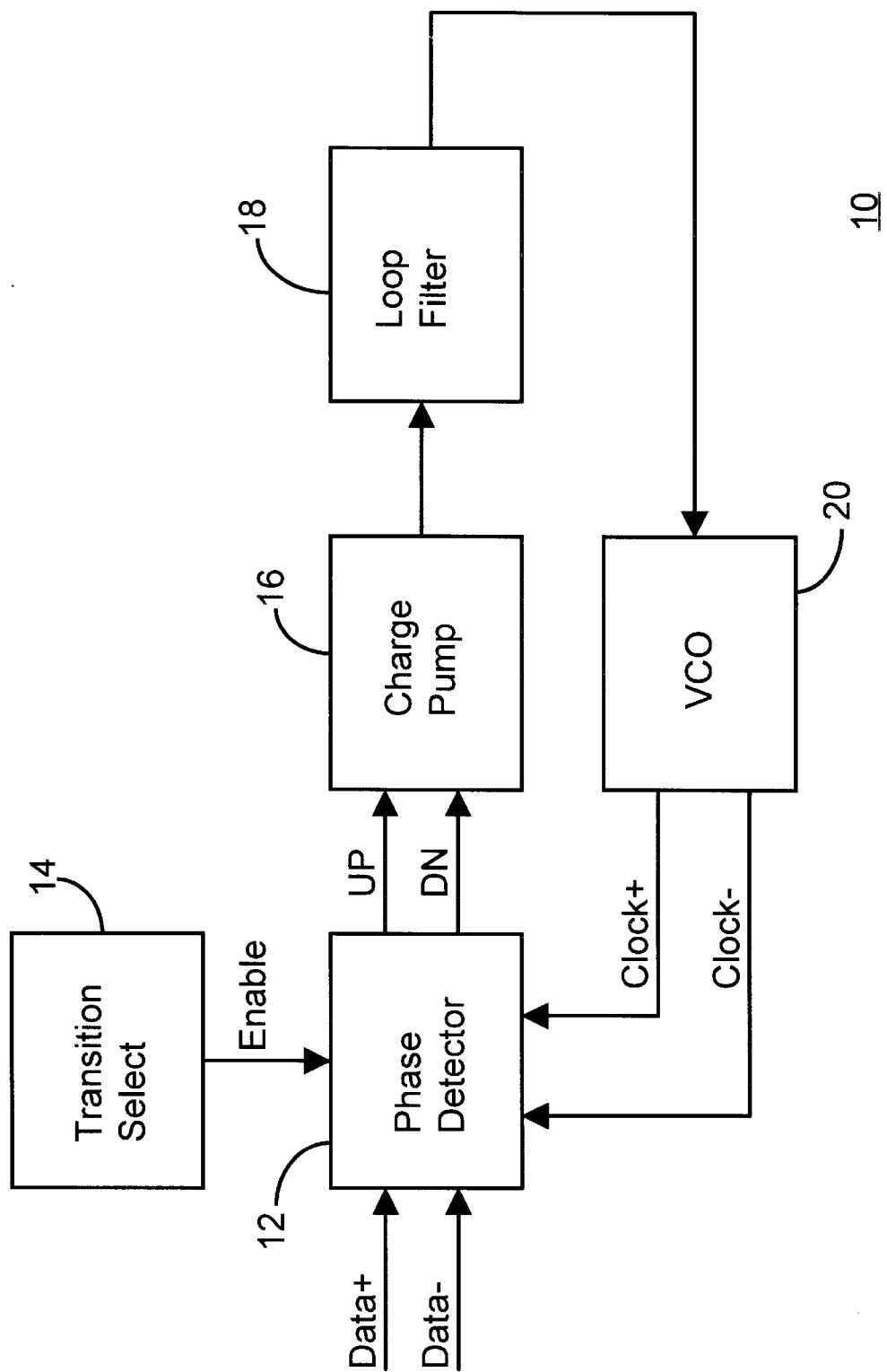
FIG. 1 is a block diagram of phase-locked loop (PLL) circuit.

A block diagram of a conventional phase-locked loop (PLL) 10 used for clock recovery is shown in FIG. 1. The PLL 10 comprises a phase detector 12 which receives data input signals, clock signals, and an enable signal from a transition select block 14. The phase detector 12 provides UP and DOWN signals to a charge pump 16. The charge pump is coupled to a loop filter 18. The loop filter 18 in turn is coupled to a voltage controlled oscillator (VCO) 20. The VCO 20 is coupled in a feedback relationship with the phase detector 12. The phase detector 12 may operate on the rising edge of the data signal, data+, or both the rising and falling edges of the data signal, data+ and data–.

The VCO 20 may have a single ended output, clock+, or differential outputs, clock+ and clock–. The transition select block 14 selectively picks the transitions of the data signal in which the phase comparison is to be made in the phase detector 12. The phase detector 12 generates the UP and DOWN signals as commonly found in charge-pump PLLs.

A prior art phase detector 12 is shown in FIG. 2. Typical timing waveforms for the detector 12 are shown in FIG. 3. The enable signal causes the phase detector 12 to generate a correction signal whenever a midbit transition of the data signal is a rising edge. The enable signal frequency is the clock signal frequency divided by two. In this embodiment, the enable signal is tied to a logic one so that the phase detector 12 operates on all the rising edges of the data signal. Note that the phase detector 12 is not only limited to Manchester encoded data. A phase detector 12 of this type is disclosed in U.S. patent application No. 07/880,172, entitled METHOD AND APPARATUS FOR PATTERN INDEPENDENT PHASE DETECTION AND TIMING RECOVERY, and assigned to the assignee of the present invention.

In general, when the clock signal phase lags the data signal rising edge, an UP signal is generated which is wider than the DOWN signal. When the clock signal phase leads the data signal rising edge, an UP signal is generated which is narrower than the DOWN signal. When the clock signal phase coincides with the data rising edge (phase-locked), an UP signal is generated which has a pulse width which is equal to that of the DOWN signal. The average value of the net signal (UP-DOWN) controls the VCO 20 (FIG. 1) in such a manner that the PLL 10 (FIG. 1) stays in lock.

The prior art phase detector 12 includes a first Flip-Flop 102 which receives an enable signal at the D input and receives data at a second input. The Q output of Flip-Flop 102 provides the UP signal. The Q output of Flip-Flop 102 is also coupled to the D input of a second Flip-Flop 104 and to one of the inputs of NAND gate 106.

A clock signal is provided to a second input of Flip-Flop 104 and a second input of NAND gate 106. The Q output of Flip-Flop 104 provides the DOWN signal. The complementary Q output of Flip-Flop 104 is coupled to the reset (R) input of Flip-Flop 102. The output of NAND gate 106 is coupled to the reset (R) input of Flip-Flop 104.

As has been before mentioned, the problem with this prior art phase detector 12 is that the net UP-DOWN signal contains a frequency component that modulates the VCO 20 (FIG. 1). This causes a frequency ripple which affects PLL operation. Also, as has also been before mentioned, the prior art phase detector 12 also has static phase offset because the clock is not centered at the data signal. Static phase offset also lowers the jitter tolerance of the PLL 10 (FIG. 1).

The present invention provides for a phase detector which substantially eliminates the above-identified problems associated with prior art phase detector. To more particularly show the advantages of the present invention, refer now to FIGS. 4–6.

Figure 4:
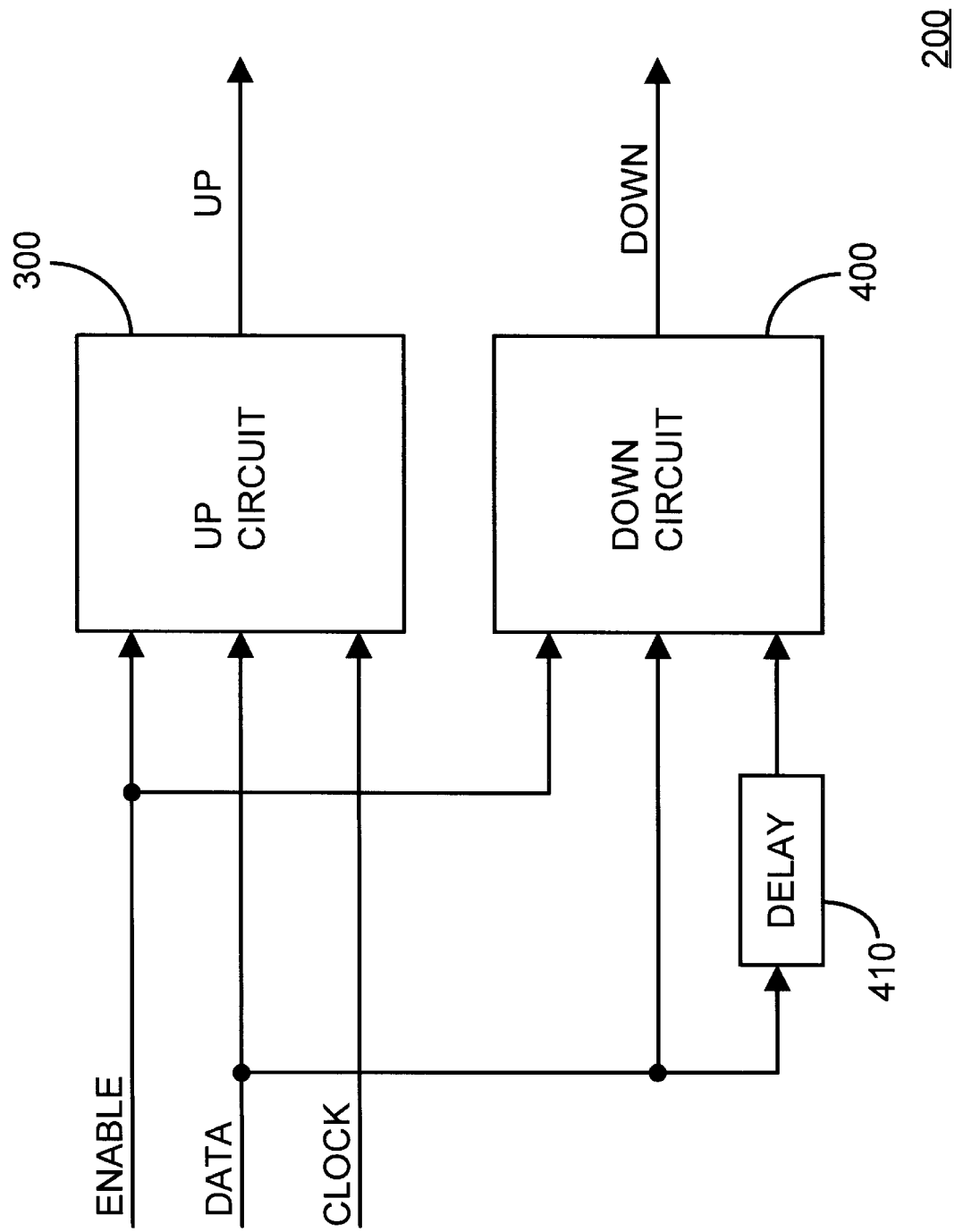
FIG. 4 is a simplified block diagram of a phase detector circuit in accordance with the present invention.

Referring now to FIG. 4, what is shown in block diagram form is a phase detector 200 in accordance with the present invention. The phase detector comprises a first circuit 300 for providing an UP signal and a second circuit 400 for providing a DOWN signal. The phase detector 200 also includes a delay element 410 on the data path coupled between the first circuit 300 and the second circuit 400 to cause the Down Signal to have a predetermined pulse width.

By providing UP and DOWN signals by separate circuits 300, 400 and adding a delay element 410 to provide a predetermined pulse width to the second (DOWN) signal, the frequency ripple problem associated with known prior art phase detectors is eliminated. To more particularly describe the operation of the present invention in a preferred embodiment, refer now to FIGS. 5 and 6 which show a detailed block diagram of a preferred embodiment of the phase detector 200 and its associated timing diagrams, respectively.

Figure 5:
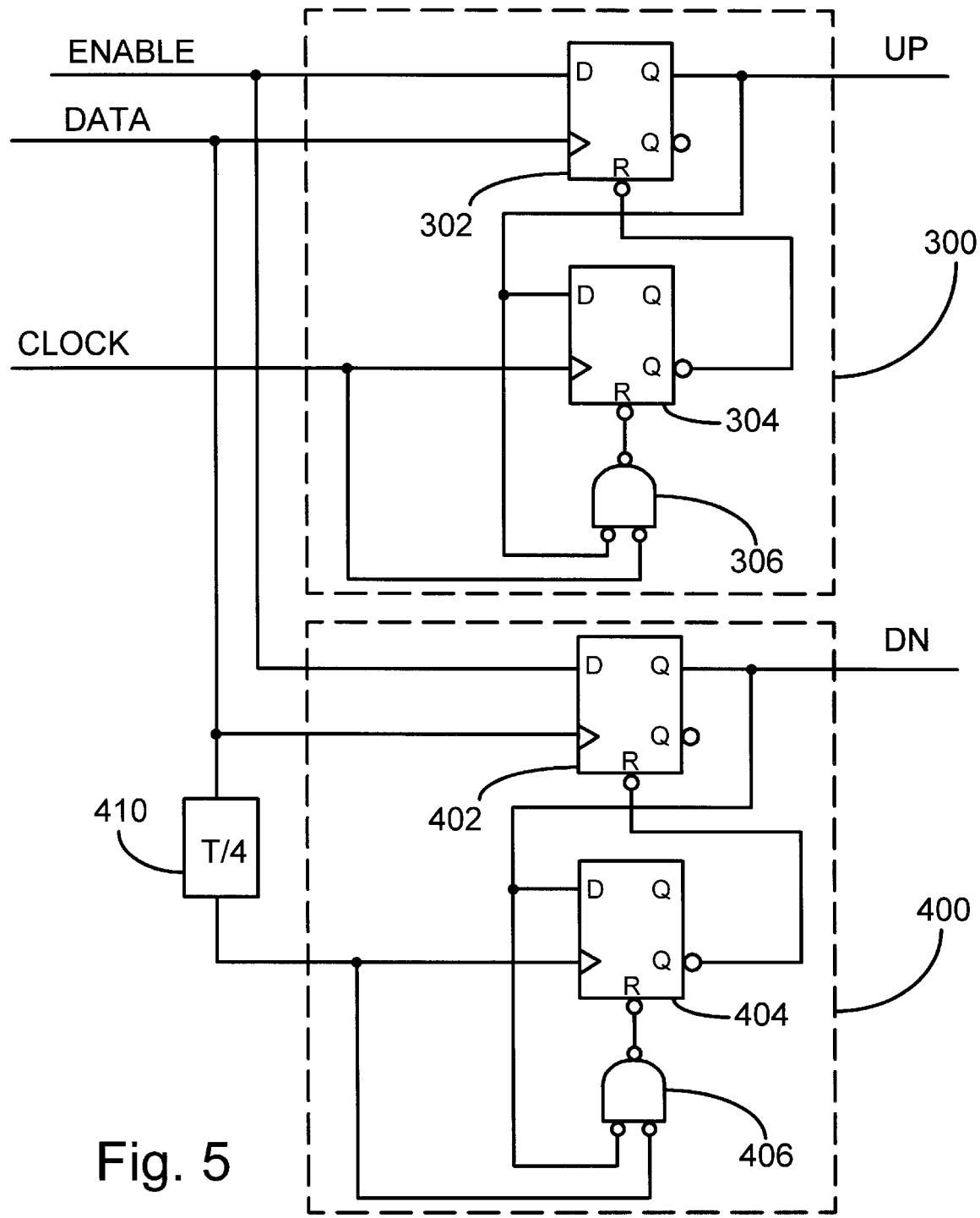
FIG. 5 is a block diagram of a preferred embodiment of the phase detector in accordance with the present invention.

Referring now to FIG. 5, the UP signal circuit 300 includes a first Flip-Flop 302 which receives an enable signal at the D input and receives data at a second input. The Q output of Flip-Flop 302 provides the UP signal. The Q output of Flip-Flop 302 is also coupled to a D input of a second Flip-Flop 304 and to one of the inputs of NAND gate 306. A clock signal is provided to a second input of Flip-Flop 304 and a second input of NAND gate 306. The complementary Q output of Flip-Flop 304 is coupled to the reset (R) input of Flip-Flop 302. The output of NAND gate 306 is coupled to the reset (R) input of Flip-Flop 304.

The DOWN signal circuit 400 includes a first Flip-Flop 402 which receives the enable signal at the D input and receives data at a second input. The data input is also provided to an input of a delay element 410, in this case a T/4 delay circuit (where T is the bit period). The Q output of Flip-Flop 402 provides the DOWN signal. The Q output of Flip-Flop 402 is also coupled to the D input of a second Flip-Flop 404 and to one of the inputs of NAND gate 406. The output of delay element 410 is provided to a second input of Flip-Flop 404 and a second input of NAND gate 406. The complementary Q output of Flip-Flop 404 is coupled to the reset (R) input of Flip-Flop 402. The output of NAND gate 406 is coupled to the reset (R) input of Flip-Flop 404.

The upper half of FIG. 5 is similar to FIG. 2 with the DOWN signal removed. The upper half of FIG. 5 generates the UP signal and the lower half of FIG. 5 generates the DOWN signal. In the lower half of FIG. 5, the two Flip-Flops 402 and 404 and the NAND gate 406 are replicated with a delay element 410 inserted between the data signal and the clock input of the second flip-flop.

The delay element 410 can be implemented as another PLL or as a delay-locked loop. The amount of delay depends upon the encoding scheme used. For example, for Manchester encoded data where the clock frequency is twice the bit rate, the delay is one quarter of the bit period (T/4).

Figure 6:
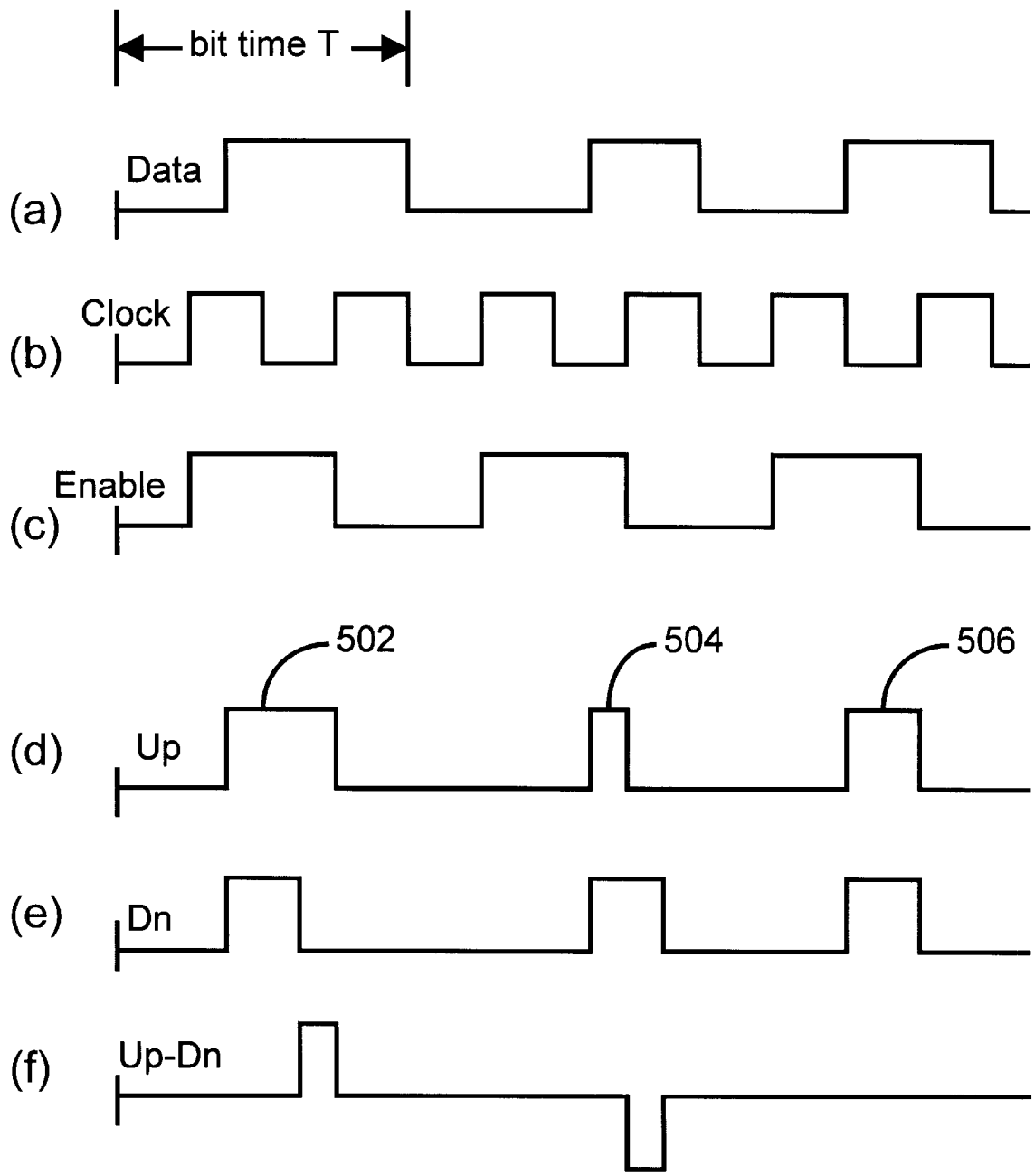
FIG. 6 is a timing diagram of the operation of the phase detector circuit of FIG. 5.

The present invention in essence moves the DOWN signal forward so that the DOWN signal occurs simultaneously with the UP signal. Referring now to FIG. 6, when the clock is locked to the data (bit cycle 506), the net signal (UP-DOWN) is equal to zero. When the clock is ahead (bit cycle 504), the net signal is negative (DOWN is greater than UP). And when the clock is delayed (bit cycle 502), the net signal is positive (UP is greater than DOWN).

Similar to the prior art, the correction information in the PLL 10 (FIG. 1) is contained in the UP pulse. The DOWN pulse, however, does not depend on the instantaneous frequency of the VCO 20 (FIG. 1) and has a fixed pulse width. The present invention eliminates the high frequency ripple problems associated with prior art phase detectors. The present invention also minimizes static phase offset and alleviates jitter peaking by not requiring a high value capacitor in the loop filter.

Although, the present invention has been described utilizing the UP signal as the signal which includes the frequency information, one of ordinary skill in the art will readily recognize that the signals could be reversed on the outputs of circuits 300 and 400 respectively and the Down signal would contain the frequency information. Also, although Flip-Flops and NAND gates have been utilized to provide the UP and DOWN signals, one of ordinary skill will readily recognize that a variety of logic elements could be utilized to provide such signals. Finally, it should be well recognized by one of ordinary skill in the art that although a delay of one quarter bit period has been disclosed, the delay can be of variable length and still be within the spirit and scope of the present invention.

Although the present invention has been described in accordance with embodiments shown, one of ordinary skill in the art will readily recognize that there could be variations to the embodiments and those variations could be within the spirit and scope of the present invention. Accordingly, many modifications may be made by one of ordinary skill in the art without departing from the spirit and scope of the appended claims.

What is claimed is:

1. A phase detector comprising:

first circuit means for receiving a data signal an enable signal and a clock signal and providing a first signal, the first circuit means comprising an UP signal circuit, the UP signal circuit further comprising:

a first Flip-Flop device for receiving said enable signal, a first reset signal, and the data signal and for providing said first signal;

a second Flip-Flop device for receiving said clock signal, said first signal, a second reset signal, and for providing the first reset signal to the first Flip-Flop device: and a first logic means for receiving said first signal and the clock signal and for providing the second reset signal to the second Flip-Flop device;

second circuit means for receiving said enable signal, the data signal and providing a second signal, the second signal occurring substantially simultaneously with the first signal; and delay means, for delaying said data signal coupled to the second circuit means for causing the second signal to have a predetermined pulse width.

2. The phase detector of claim 1 in which the delay means comprises a one quarter bit delay circuit.

3. The phase detector of claim 1 in which the first logic means comprises a NAND gate.

4. The phase detector of claim 3 in which the second circuit means comprises a DOWN signal circuit, the DOWN signal circuit further comprising:

a third Flip-Flop device for receiving the enable signal, a third reset signal, and the data signal and for providing a DOWN signal;

a fourth Flip-Flop device for receiving a signal from the delay means, the DOWN signal, and a fourth reset signal, and for providing the third reset signal to the third Flip-Flop device; and a second logic means for receiving the DOWN signal and the signal from the delay means signal and for providing the fourth reset signal to the fourth Flip-Flop device.

5. The phase detector of claim 4 in which the second logic means comprises a NAND gate.

6. A phase detector comprising:

first Flip-Flop circuit means for receiving a data signal, an enable signal and a clock signal and providing an UP signal;

second Flip-Flop circuit means for receiving the data signal and said enable signal providing a DOWN signal, the DOWN signal occurring substantially simultaneously with the UP signal; and delay means, for delaying said data signal coupled between the first and second Flip-Flop circuit means for causing the DOWN signal to have a predetermined pulse width, wherein the first Flip-Flop circuit means comprises:

first Flip-Flop device for receiving said enable signal, a first reset signal, and the data signal and for providing the UP signal;

a second Flip-Flop device for receiving said clock signal, the UP signal, a second reset signal, and for providing the first reset signal to the first Flip-Flop device; and a first logic means for receiving the UP signal and the clock signal and for providing the second reset signal to the second Flip-Flop device, and further wherein the second Flip-Flop circuit means comprises:

a third Flip-Flop device for receiving the enable signal, a third reset signal, and the data signal and for providing the DOWN signal;

a fourth Flip-Flop device for receiving a signal from the delay means, the DOWN signal, and a fourth reset signal, and for providing the third reset signal to the third Flip-Flop device; and a second logic means for receiving the DOWN signal and the signal from the delay means and for providing the fourth reset signal to the fourth Flip-Flop device.

7. The phase detector of claim 6 in which the delay means comprises a one quarter bit delay circuit.

8. The phase detector of claim 6 in which the first logic means comprises a NAND gate.

9. The phase detector of claim 6 in which the second logic means comprises a NAND gate.

* * * * *